United States Patent [19]

Thomas

[11] Patent Number: 5,675,161
[45] Date of Patent: Oct. 7, 1997

[54] CHANNEL ACCELERATED TUNNELING ELECTRON CELL, WITH A SELECT REGION INCORPORATED, FOR HIGH DENSITY LOW POWER APPLICATIONS

[76] Inventor: Mammen Thomas, 1081 Corvette Dr., San Jose, Calif. 95129-2906

[21] Appl. No.: 411,533

[22] Filed: Mar. 28, 1995

[51] Int. Cl.[6] .......................... H01L 29/76; H01L 29/788; H01L 29/792; G11C 11/34
[52] U.S. Cl. .......................... 257/316; 257/314; 257/319; 365/185.26; 365/185.33
[58] Field of Search .................. 257/314, 315, 257/316, 317, 318, 319, 320, 321, 322, 326; 365/185, 185.01, 185.26, 185.28, 185.33

[56] References Cited

U.S. PATENT DOCUMENTS

| | | | |
|---|---|---|---|
| 5,071,782 | 12/1991 | Mori | 257/315 |
| 5,359,218 | 10/1994 | Taneda | 257/321 |
| 5,455,792 | 10/1995 | Yi | 257/316 |

FOREIGN PATENT DOCUMENTS

| | | | |
|---|---|---|---|
| 61-256673 | 11/1986 | Japan | 257/316 |
| 62-76563 | 4/1987 | Japan | 257/316 |
| 6-163925 | 6/1994 | Japan | 257/315 |

OTHER PUBLICATIONS

"Vertical EEPROM Cell"; IBM Technical Disclosure Bulletin, vol. 35, No. 4B, Sep. 1992, pp. 130–131.

*Primary Examiner*—Mahsid D. Saadat
*Assistant Examiner*—Alice W. Tang

[57] ABSTRACT

Improved non-volatile memory cells capable of being written and erased electrically, suitable for high density low voltage applications are disclosed. Writing the cells is by using the Channel Accelerated Carrier Tunneling (CACT) method for programming memories, (patent application Ser. No. 08/209,787 filed on Mar. 11, 1994) and the erase is by tunneling through a thin oxide region. Two structural embodiments are disclosed. First embodiment, Trenched-Channel Accelerated Tunneling Electron cell (Tr_CATE), and a second embodiment Trench Wall-Channel Accelerated Tunneling Electron cell (Tw-CATE), both make use of separate regions of the channel for write and erase and hence provide high reliability of operation. The cells disclosed use a vertical step etch to form part of the channel to accelerate the carriers and also to act as a select gate without increasing the cell area. By separating the portion of the gate on the side wall from that over the surface, along a continuous channel between the source and drain, independently operating storage region and a select/accelerating region are formed along the same channel. This structure allows independent voltages to be applied to the storage gate and the accelerating gate. These CATE cells allow low supply current operation. Since all the operations are low current operations, efficient pumps can be used on chip to provide the required high voltages where needed.

11 Claims, 5 Drawing Sheets

EEPROM CELL (CROSS SECTION)

PRIOR ART

FLASH CELL (PRIOR ART)

DPT - CATE CELL**

PRIOR ART

T_R - CATE MEMORY CELL
BASED ON CACT PROGRAM

CELL-2    CELL-1

Tw-CATE MEMORY CELL
BASED ON CACT PROGRAM

CELL-2 | CELL-1

CHANNEL ACCELERATED TUNNELING ELECTRON CELL, WITH A SELECT REGION INCORPORATED, FOR HIGH DENSITY LOW POWER APPLICATIONS

BACKGROUND—FIELD OF INVENTION

This invention relates to a high reliability non volatile memory cell structure, which can be electrically written and erased, for high density, low voltage and low power applications.

DESCRIPTION OF PRIOR ART

The current electrically programmable and erasable non-volatile memory cells consists of EEPROMs (Electrically Erasable Programmable ROMs), Flash Memories and Double Poly Trenched channel Accelerated Tunneling Electron (DPT-CATE) cell for memory applications (patent application Ser. No. 08/243,507 by Applicant: Mammen Thomas, filed on May 16, 1994).

a) The EEPROMs (FIG. 1 ) are as the name implies electrically programmable and erasable. They are programmed and erased through a thin oxide area called tunnel area (2) which normally has an oxide thickness between 40 and 130 Angstroms and is grown on top of a doped silicon region (3). By applying a high voltage gradient across this tunnel oxide the electrons can be made to move to and from a floating gate (5) over the tunnel oxide. The tunnel process is a very slow process and hence the EEPROMs are slow to write and slow to erase. During erase the devices tend to go into depletion during erase, due to removal of electrons from the floating gate. In order to have an array of devices operate in series it is necessary to have a select transistor(12) isolating the memory element in series with the storage device. The need for a separate tunnel area with diffusion and need for additional isolation transistor make the prior art EEPROM cells large in size and hence unsuitable for high density applications.

b) The typical Flash Cell (FIG. 2) is a new development and is an electrically erasable programmable ROM cell which use the EPROM write, using hot electrons generated by impact ionization, to write data into the cell and FN, tunnel process to erase the data. A high drain voltage is applied to the cell to generate a large volume of carriers by impact ionization at the drain (3a) depletion region (14a) when the device operates under saturated conditions. The drain and channel doping are adjusted to provide high fields suitable for carrier injection at the drain depletion region. The ionized carriers will consist of both electrons and holes and these will have resultant velocities in random directions after impact ionization. The positively charged holes generated during impact ionization at the drain depletion region, get collected by the substrate (1a) and flow to ground producing a large current component which is wasted as substrate current. A very small percentage of the negatively charged particles, electrons, generated by impact ionization will have velocity component which is in a direction suitable for collection by the floating gate (7a) electrode. These will be accelerated towards the floating gate by the high voltage on the floating gate which is coupled down from the control gate (9a) through the thin insulating layer (8a). These electrons are collected by the floating gate and are stored in the floating gate providing a net negative charge in the floating gate electrode. The balance of the electrons generated, having unfavorable velocity component for collection by the floating gate electrode, flow to the drain (3a) and are returned to the supply as excess drain current. The charge due to the carriers collected by the floating gate modify the threshold of the device indicating a charged state.

The erase is accomplished by allowing the electrons to tunnel through the thin gate oxide (6a), typically 40 to 120 Angstroms in thickness, by application of a voltage gradient across the tunnel oxide. This is accomplished by applying a high voltage to one of the junctions, preferably the source junction (4a), while holding the control gate (9a) at low or zero voltage. The erase can also be accomplished by application of a negative voltage to the control gate and simultaneously applying a positive voltage to the source. The tunneling takes place from the floating gate to the source region edge (13a) which is thermally driven under the gate oxide.

The present day Flash cells suffer from a number of problems to achieve low power and low voltage applications. These include but are not limited to:

1. The flash cells need high power supply to provide high current at relatively high voltage to the drain of the flash device. The high voltage is necessary to ensure existence of high fields at the drain depletion region to achieve hot electron generation and high currents are needed to ensure that sufficient electrons with the correct velocity component are available to be collected by the floating gate.

2. Only a small portion of the generated carriers are usable for programming the cell, the balance is wasted as drain current and as substrate current. This is due to the fact that in a typical flask during hot carrier generation, the generated electrons have random velocity directions and only those with a velocity component towards the floating gate can be collected by the floating gate, the rest being collected by the drain. The generated holes are all swept to the substrate, collected by the substrate terminal and removed as non usable substrate current.

3. The large substrate current component can cause reliability problems due to latchup in nearby circuits by charging up the substrate. This also can result in excess noise generation due to ground bounce.

4. The need for large drain voltages mandate increased spacing requirements between cells, increasing the area required to achieve a given density of memory.

5. The need to use high drain voltage also reduce the horizontal salability of the cell by requiting a minimum gate length to withstand the applied voltages.

6. Vertical scaling with reduction in gate oxide thickness for improved performance will also create problems for the cell by allowing tunneling at voltages close to the applied drain voltage during write and hence cause disturb problems.

7. The use of thinner gate oxide in current flash cells make sustaining the field at the drain more difficult and act against the carrier generation need.

8. The inability to thin down the gate oxide due to the need for high field generation at the drain makes the use of high erase voltage a must, typical erase voltages needed is approximately 10 V across a 100A oxide.

9. The present day flash cells use the drain side to write and the source side for erase. This is necessary as the trapping of carriers in the oxide due to high fields applied cause degradation and window closing to occur as well as causing the threshold of the devices to spread from an initial value. This will cause erase problems even before the oxide reliability become important. This makes block or bulk erase the only options available for erase of the array.

10. The flash cells of the prior art type cannot be operated in depletion, (after erase) as the depleted cells connected to a bit line will, even when unselected, cause current flow in the bit line when a read voltage is applied. This will cause all the cells to be read as being erased even when the cell being accessed on the bit line is in a programmed condition, causing bit line failure.

11. The need to ensure that the cells do not go into depletion makes it necessary to have closely controlled thresholds in the array during operation, even though some cells would have seen a larger number of write/erase cycles than others. This puts a larger strain on the technology and process and makes manufacturing expensive and difficult.

12. The need for cells to have closely matched thresholds after erase make it necessary to start all cells to be erased, in bulk and block erase operation, from a base threshold voltage. This is done by writing all cells before erasing them. This practice makes all cells in a block to be cycled, even though the changes are being made to a few bits in the block. This need increases the ware out and reduce the reliability of the cells by increasing the write/erase operations on the cells.

13. The flash cells which are using the EPROM write and tunnel erase cannot be modified to write or erase bits without increasing the chip area substantially to provide for addressing the bits individually at the source during erase. This will increase the cell size and cause the cells to be not viable for use in high density memory applications.

c) The DPT-CATE cell (FIG. 3) overcome some of the disadvantages of the current Flash memories in terms of the reliability and low power operation but does not allow for the cells to operate in depletion mode, this makes designing with these cells as complicated as with the prior art flash memory cells. The cells write by using the of the velocity electrons in the channel (CACT method), accelerated in a channel under a gate oxide (6) on the side wall of a trench (5) etched into silicon, directed towards a discontinuity (17) in the channel, formed at an intersection of the gate oxide and a tunnel oxide (12) on the surface of silicon, spaced away from the side wall of the trench. The channel itself is formed in silicon between a source diffusion (7) and a drain (4) diffusion on the surface of silicon. A floating gate (8) electrode is placed over the gate oxide and tunnel oxide to act as the storage node. This floating electrode overlaying the oxide over the discontinuity in the channel allows the kinetic energy of the channel electrons to be used, to enhance the field applied across the oxide at the discontinuity, by the storage electrode allowing channel accelerated carrier tunneling to take place. The write or program operation hence takes place at the channel discontinuity. Since high junction fields and large wasted currents are eliminated, the need for high power supplies having high current and high voltage capabilities, which form a major limitation for the use of present day flash memories in low power, applications, is avoided.

The erase in the case of the DPT-CATE cell is by tunneling at the drain diffusion (18) by application of a high voltage gradient across the tunnel oxide over laying the drain diffusion to allow tunneling of stored carriers from the floating gate (8) to the drain (4). The voltage gradient can be applied by a high positive voltage on the drain, a high negative voltage applied to the floating gate or as a preferred mode of operation a combination of a negative voltage on the floating gate and a positive voltage on the drain of the device. The erase taking place at the underlap of the drain diffusion under the gate on the Silicon surface.

The DPT-CATE cell, by having the write and the erase drain voltages applied at the drain through the bit line allow for individual bits to be changed, that is allow erase and write of individual bits unlike the flash cells.

The DPT-CATE cell, due to the fact that it does not incorporate a select region still, still suffers from a few of the disadvantages of the present day flash cells. They include:

1. The cells in an array need to be continuously monitored during erase to ensure that they do not go into depletion mode, thereby allowing current flow even in the unselected state. Allowing the cells to be in depletion will cause current flow in the bit line even when a cell which is off is selected and cause it to be read as an on cell. (column failure will occur)

2. The need to ensure that the cells do not go into depletion makes it necessary to have closely controlled thresholds in the array during operation, even though some cells would have seen a larger number of write/erase cycles than others. This puts a larger strain on the technology and process and makes manufacturing expensive and difficult.

3. The need for cells to have closely matched thresholds after erase make it necessary to start all cells to be erased, in bulk and block erase operation, from a base threshold voltage. This is done by writing all cells before erasing them. This practice makes all cells in a block to be cycled, even though the changes are being made to a few bits in the block. This need increases the ware out and reduce the reliability of the cells by increasing the write/erase operations on the cells.

OBJECTS AND ADVANTAGES

The Selected Channel Accelerated Tunneling Electron (S-CATE) Cell and the Trenched Channel Accelerated Tunneling Electron cell disclosed have a number of advantages over the existing flash memory cells.

1. The cell uses the majority carriers in the channel as the major charging carriers and do not depend on the high fields at the junction to generate hot carriers for charging.

2. The use of majority carriers and reduction of impact ionization allow lower voltages to be applied on the accelerating junctions.

3. The reduction in impact ionization reduces the formation of unusable positive charge careers which constitute a large component of the supplied current during programming, thereby reducing the power supply capability needed.

4. The use of the velocity of careers in the channel to enhance the write characteristics of the cell allow reduced applied voltage on the gate electrodes.

5. The reduction in the depletion layer fields due to reduced junction voltages applied and the reduced field across the oxides from lower applied gate voltages improve the reliability of the cell.

6. Reduction or elimination of impact ionization reduce latch-up problems and associated reliability concerns for the cell.

7. The use of lower voltages at the junctions and the gates for programming make the cell suitable for low voltage programming operations and single power supply operations.

8. The lower voltages and currents used allow better vertical scaling of oxides and junctions allowing the optimum use of technology advances.

9. The reduced voltage of operation allows for reduced isolation requirements and allow for closer packing of the cells.

In addition the cells with select device incorporated, disclosed, have the following additional advantages over both the flash and DPT-CATE cells, 10. The cells by controlling the write and erase operations by voltage application on the decoded drain through the bit lines allow for bit, byte and block erase as required.

11. Use of a select device which also acts as the accelerating transistor, but with a gate which is independently controlled allow the devices to be erased to depletion without affecting the neighboring devices during read. This makes the cells easier to design with.

12. Having a select transistor in series allow cells to be erased without first writing them as the spread in threshold is not a critical factor in the operation of the array.

13. Having an independently controlled select gate allow optimization of the gate voltage to achieve high velocity with low drain voltages applied to the device. It also allows high accelerating voltages to be applied to the control gate region over the storage node allowing fast write by channel accelerated tunneling carrier method without impacting the acceleration characteristics of the carriers.

14. The independently controlled select region allow low voltages to be impressed on the drain and the accelerating gate (select gate) while applying high voltage to the control gate without increasing the programming current.

15. The use of the select portion of the channel reduce the leakage currents and read disturb problems associated with present day devices by isolating the unselected cells from the circuit.

Details of Reference Alpha—Numerals in Figures

Figure 1:
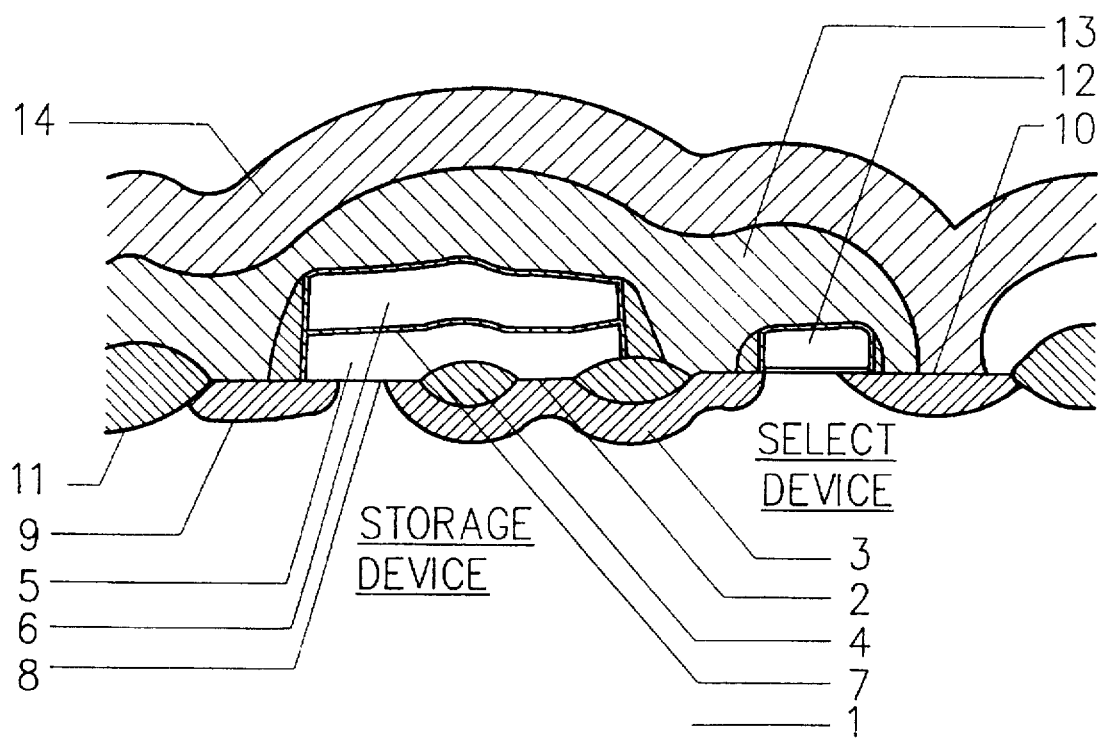
FIG. 1—is a typical cross section of a prior art EEPROM cell.

FIG. 1. (Prior Art-EEPROM cross-section)
1. Semiconductor Substrate.
2. Tunnel oxide.
3. Tunnel Diffusion.
4. Buried oxide.
5. Floating gate/storage node.
6. Control gate electrode.
7. Interpoly dielectric, ONO or oxide.
8. Gate oxide.
9. Source Diffusion.
10. Drain diffusion contact of select device.
11. Field oxide.
12. Select transistor, word line.
13. Dielectric layer.
14. Metal bit line.

Figure 2:
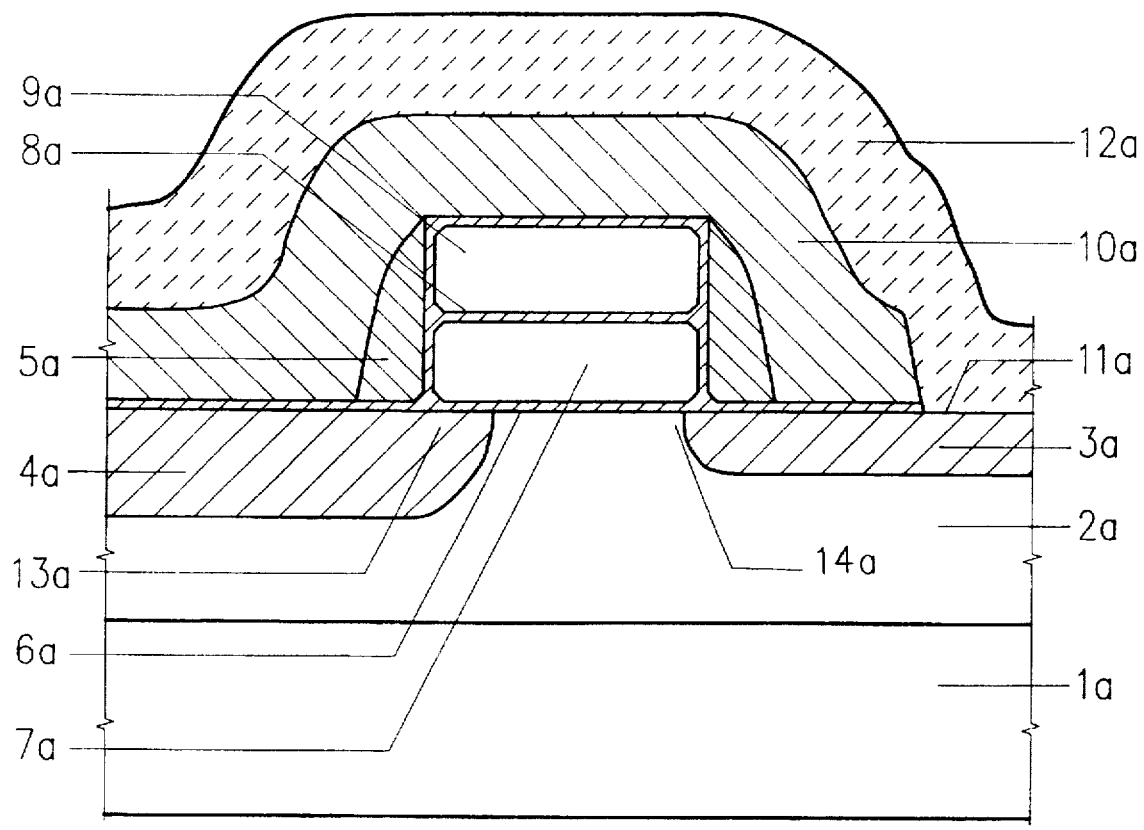
FIG. 2—is a typical cross section of a prior art flash memory cell

FIG. 2. (Prior Art Flash cell cross-section.)
1a. Semiconductor Substrate material.
2a. Epitaxial silicon material.
3a. Drain doping
4a. Deep Source diffusion.
5a. Poly sidewall oxide spacer.
6a. Tunnel oxide/gate oxide.
7a. Floating gate/storage node.
8a. Inter-poly dielectric.
9a. Control gate/word line.
10a. Isolation dielectric.
11a. Drain contact.
12a. Metal bit line.
13a. Tunnel erase region due to source diffusion edge.
14a. Hot electron write junction region.

Figure 3:
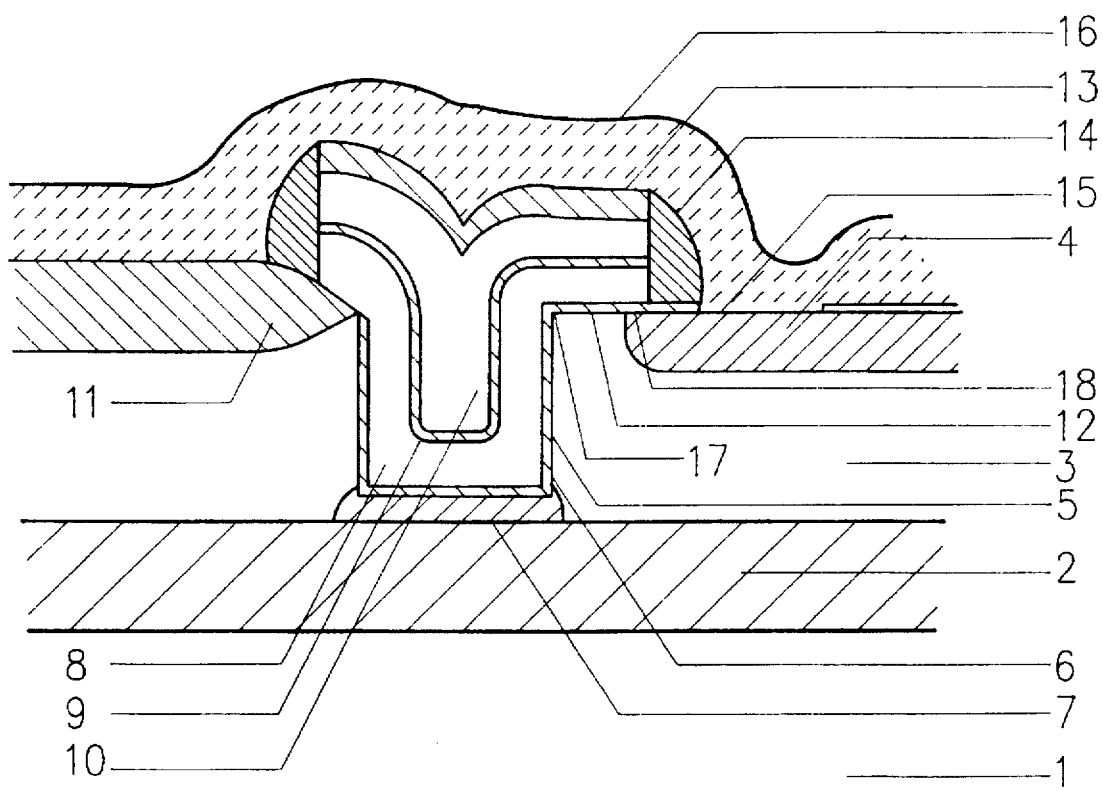
FIG. 3—is a cross section of the prior art DPT-CATE cell

FIG. 3. (Prior art DPT-CATE cell cross-section.)
1. Substrate silicon material.
2. Doped buried layer.
3. Silicon epitaxial layer.
4. Drain.
5. Trench into silicon.
6. Gate oxide on trench side wall.
7. Source doping at bottom of trench connecting with buried layer doping.
8. Floating gate/storage node.
9. Inter-poly dielectric.
10. Control gate/word line.
11. Field oxide for isolation.
12. Tunnel oxide.
13. Insulating dielectric layer.
14. Spacer oxide.
15. Drain contact to bit line.
16. Metal bit line.
17. Channel discontinuity for channel accelerated carrier tunneling write.
18. Tunnel erase region.

Figure 4:
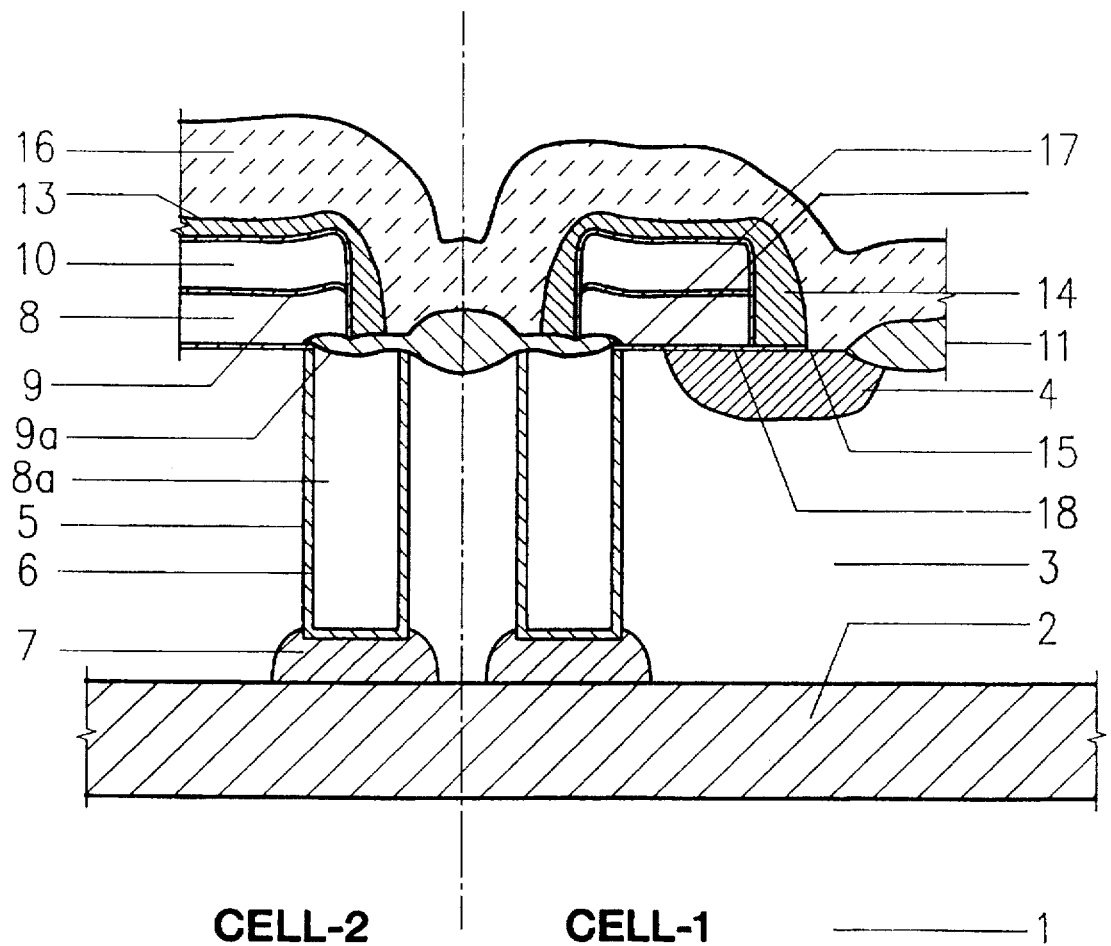
FIG. 4—is a cross section of a Tr.-CATE cell

FIG. 4. (Disclosed Tr-CATE cells cross-section)
1. Semiconducting substrate. (silicon)
2. Doped buried layer.
3. Semiconducting Epitaxial layer. (silicon)
4. Doped drain region.
5. Gate dielectric (oxide)
6. Etched trench
7. Source doping at bottom of trench
8. Second conductive layer/floating gate/storage node (polysilicon 2).
8a. First conductive layer (polysilicon 1).
9. Inter layer dielectric (ONO)
9a. Insulating dielectric (polyoxide).
10. Third conductive layer/word line (polysilicon 3).
11. Field isolation (silicon dioxide).
12. Tunnel dielectric (silicon dioxide).
13. Top insulating layer (oxide)
14. Poly side wall insulator/LDD implant limitter (oxide).
15. Drain contact region.
16. Fourth conductive layer/bit line (metal 1 ).
17. Discontinuity in channel for channel accelerated carrier tunneling write.
18. Tunnel erase region.

Figure 5:
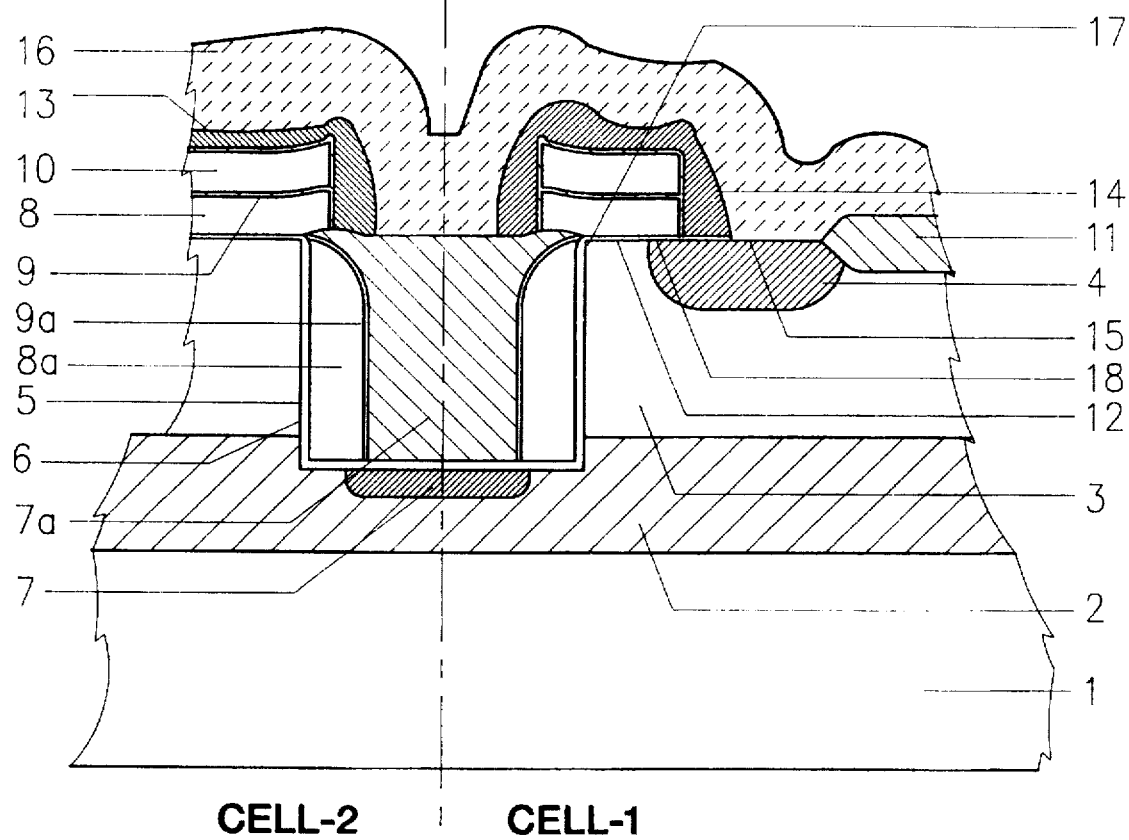
FIG. 5—is a cross section of a Tw-CATE cell

FIG. 5. (Disclosed Tw-CATE cells cross-section)
1. Semiconducting substrate. (silicon)
2. Doped buried layer.
3. Semiconducting Epitaxial layer. (silicon)
4. Doped drain region.

5. Gate dielectric (oxide)
6. Etched trench
7. Source doping at bottom of trench
7a. Oxide fill of trench
8. Second conductive layer/floating gate/storage node (polysilicon 2).
8a. First conductive layer (polysilicon 1, side wall polysilicon.)
9. Inter layer dielectric (ONO)
9a. Insulating dielectric (polyoxide).
10. Third conductive layer/word line (polysilicon 3).
11. Field isolation (silicon dioxide).
12. Tunnel dielectric (silicon dioxide).
13. Top insulating layer (oxide)
14. Poly side wall insulator/LDD implant limitter (oxide).
15. Drain contact region.
16. Fourth conductive layer/bit line (metal 1).
17. Discontinuity in channel for channel accelerated carrier tunneling write.
18. Tunnel erase region.

STRUCTURE AND OPERATION OF THE CATE CELLS. (FIG. 4 & 5)

(first preferred implementation of the structure)

The preferred embodiment of the Tr.-CATE cell is provided as an example for manufacture and operation of the cells. This cell uses a gate formed by filling a trench with a conductive material, typically polysilicon, to form the select/accelerating gate. The Tw-CATE cell is different in only the fact that it uses partial filling of the trench and an etch back to form independent select/accelerating gates on the two side walls of a single trench for two adjacent cells. It is understood that other modifications, simplifications, and departures lying within the spirit of the invention description and scope defined by the claims will be obvious to individuals proficient in the art.

Structure

The Tr-CATE cell (Ref: FIG. 4) and Tw__CATE cell (FIG. 5) are both triple poly non-volatile memory cells which can be programmed and erased electrically. The cells utilize the channel accelerated carrier tunneling (CACT) method to achieve programming with low drain voltages and currents, and uses Fowler-Nordheim tunneling to erase the data stored. The method of programming is detailed in co-pending patent application, Ser. No. 08/209,787 named 'Channel Accelerated Carrier Tunneling-(CACT) method for programming memories' by Mammen Thomas filed on Mar. 11, 1994, which is expressly incorporated herein by reference.

Both types of cells comprise of a semiconducting substrate (1), typically Silicon, doped with an impurity, typically N- type, having an orientation, typically <100>, and a resistivity, typically of 0.5 to 3-ohm. cm- is used as starting material. A semiconducting substrate doped with first impurity type, typically P type, with a highly doped buried layer (2) of opposite type of doping, having an impurity of the second type, typically N- type, introduced into the substrate at regions defined by a masking operation to improve the performance can be used as an alternate substrate. An epitaxial semiconducting layer (3), having a light doping with an impurity of the first type, typically P-type, is grown over the substrate to provide a low defect layer for device construction. The thickness of the epitaxial layer is adjusted to provide a reasonable height of side wall for a trench to be etched into the epitaxial layer. This epitaxial layer can be from 0.3 microns to 3 microns. This stack of semi conducting material form a typical substrate material stack over which the device construction is carried out.

The structural and process differences between the preferred embodiment, Tr-CATE cell and the second embodiment Tw__CATE cell are in the formation of the select/accelerating portion of the gate and the refill of the trench. In the case of the Tr__CATE cell a narrow trench (6), typically of minimum dimension, is masked and etched into the semiconducting material such that a step having an edge along the intersection of the epitaxial surface and a side wall of the trench is formed. The etch is stopped preferably inside the epitaxial material with the bottom close to, touching or slightly into, the buried layer. A gate dielectric (5), typically silicon dioxide, is deposed on the side wall of the trench, typically 80 to 300 Angstroms in thickness, depending on the technology used for manufacture. The bottom of the trench also has a similar dielectric deposed on it, thereby isolating the trench from the semiconducting material outside the trench. A doping of a similar impurity as the buried layer, typically N-type is now introduced, preferably by implantation, into the bottom of the trench (7). This doping forms the source of a MOS device at the completion of the processing. In the preferred embodiment the doping at the bottom of the trench makes contact with the highly doped substrate or the buried layer for reduction of source resistance and external contact. The trench is now filled with a first conductive gate material (8a), typically doped polysilicon, and planarized such that the surface of the material in the trench is substantially same as the surface of the semiconducting epitaxial layer. An insulating dielectric layer, typically silicon oxide (9a), is now deposed on the surface of the conductive material so as to seal the conductive material inside the trench. In the preferred embodiment a polysilicon oxide is grown on the surface of the exposed polysilicon to achieve this.

In the second embodiment, the Tw-CATE cell a wider trench (6), typically of 0.4 to 1.0 microns in width dimention, is masked and etched into the semiconducting material such that steps having edges along the intersection of the epitaxial surface and a side wall of the trench are formed. The etch is stopped preferably inside the epitaxial material with the bottom close to, touching or slightly into, the buried layer. A gate dielectric (5), typically silicon dioxide, is deposed on the side wall of the trench, typically 80 to 300 Angstroms in thickness, depending on the technology used for manufacture. The bottom of the trench also has a similar dielectric deposed on it, thereby isolating the trench from the semiconducting material outside the trench. A first conductive material (8a), typically doped polysilicon having 1000A to 3000 Angstroms thickness, is deposited and etched back to leave a spacer regions on the sides of the trench covering the gate oxides. The etch clears first conductive layer from the bottom of the trench producing two independent select/accelerating regions on either sides of the trench with the top of the conductive layer remaining below the level of the surface of the epitaxial layer, typically 200 to 1000 Angstroms. A doping of a similar impurity as the buried layer, typically N-type is now introduced, preferably by implantation, into the bottom of the trench (7). This doping with the buried layer forms the source of a MOS device at the completion of the processing. The surface of the first polysilicon is now covered with an insulating film (9a), typically oxide. The trench is now filled with an material (7a), typically oxide, and planarized such that the surface of the material in the trench is substantially same as the surface of the semiconducting epitaxial layer.

For both embodiments a tunnel dielectric (12), typically tunnel oxide having a thickness between 50 and 130 Angstroms, is deposed over the surface of the semiconducting epitaxial material, over areas of the semiconducting material forming the memory region of the memory cell. The balance of the areas of the surface is covered by a thicker dielectric (11), typically oxide, providing insulation between the memory cell and other neighboring devices on the semiconducting surface. A second conductive layer, typically polysilicon, polysilicon-2, is deposed on the surface of the semiconductor material. This second conductive layer is defined and etched to form a floating gate electrode (8) acting as a storage node for the memory cell. The floating gate overlays the tunnel oxide and extends over the edge of the trench overlaying the insulating dielectric layer over the trench. An inter-layer dielectric (9), is deposed over the floating gate to separate it from a third layer of conductive material (10), typically polysilicon, polysilicon-3, deposed over the floating gate. The inter-layer dielectric is preferably of material providing, or materials combined together providing, high dielectric constant, high breakdown voltage and low leakage. This is to provide good capacitive coupling between the floating gate and the third layer of conductive material, typically the interlayer dielectric is silicon oxide or ONO. The third conductive layer forms the control gate for the memory cell allowing voltages to be applied to the floating gate by capacitive coupling during programming and erase operations. The second conductive layer, the inter layer dielectric and the third conductive layer together form a storage element. A doped region, drain, having a similar type of impurity as the source is now formed on the surface of the semiconducting material adjacent the edge of the floating gate polysilicon spaced away from the side wall of the trench. This doping extends under the floating gate but is separated from it by the tunnel oxide. The region of the drain extending under the floating gate form the tunnel erase region (18). A channel of a MOS device is thus formed in the semiconducting material, between the source and the drain doped regions, under the gate oxide on the side wall of the trench and the tunnel oxide on the surface of the semiconducting material. This integrated channel hence has two independently controlled regions, one a select accelerating region, controlled by the potential on the first conductive material over lying the gate oxide on the trench side wall, and a second memory region, under the memory element on the surface of the semiconducting material, controlled by the charge stored in the floating gate combined with the potential applied to it by coupling down from the control gate. A carrier discontinuity (17) exists in the channel at edge of the step formed by surface of the semiconducting material and the side wall of the trench at the intersection of the tunnel oxide and the gate oxide due to a change in direction of the carriers from a vertical direction (from the bottom of the substrate to the surface) to a horizontal direction (across the substrate), along the side wall of the trench, towards the discontinuity, that channel accelerated tunneling is achieved at the discontinuity. An insulating dielectric layer over lays the third conductive layer and isolates it from a fourth conductive layer, typically metal making contact (15) to the drain, forming a metal bit line (16).

Operation

The Tw-CATE cell is functionally similar to the Tr-CATE cell. The programming of the cell (write) is accomplished by CACT write method using the velocity of the carriers accelerated in the channel, by applying a voltage to the polysilicon1, the select/accelerating gate (8a), typically between 1.0 and 5 V, to turn the select/accelerating region of the channel on, applying a second voltage to the drain (4) of typically between 1 and 5 V through the metal bit line (16), and applying a higher third voltage to the control gate (10) which gets capacitively coupled down to the floating gate (8). The channel carriers are now accelerated along the channel formed under the gate oxide (5). They are directed at the discontinuity (17) in the channel, where they come under the further accelerating field due to the voltage on the floating gate electrode. The velocity of the carriers enhanced by the field due to the floating gate cause carrier accelerated tunneling to occur at the discontinuity and charge the floating gate storage node (8). When charge accumulates in the floating gate overlaying the tunnel oxide (12) over the memory region of the channel on the surface of the semiconducting material, it modulates the conductivity of the channel and hence store data. If there is low voltage on the control gate or if the drain voltage is pulled to ground, channel accelerated tunneling will not take place. Typically electrons are the majority careers in the channel and the floating gate accumulates negative charge during write shutting off the device.

The cell erase is accomplished by applying a potential gradient across the tunnel oxide portion between the drain (4) underlying the tunnel oxide (18) and the floating gate electrode (8) of sufficient magnitude to cause tunneling of carriers from the floating gate to the drain. The preferred mode of erase is by applying a negative voltage on the control gate which is coupled down to the floating gate, and by applying an additional positive voltage to the drain, sufficient to cause tunneling across the oxide. The removal of charge from the floating gate changes the conductivity of the memory region of the channel in a direction opposite to that during program. The select gate (8a) is grounded during the erase operation. In the preferred mode it is expected that the floating gate will loose extra charge from the floating gate storage node and the memory device, on the surface of the semiconductor, will be in a depletion condition, that is in a condition where the device is capable of conducting without voltage on the floating gate.

The cell is read by applying a low voltage, typically 2 to 3 V, to the drain (4) and to the select gate (8a), sufficient to turn the select/accelerating region of the channel on and sensing the current flow from source to drain which is a measure of the conductivity of the memory region of the channel. Though this is the preferred operating mode the device can be read by application of a low voltage on the drain (4), control gate (10) and the select gate (8) to ensure that cells which are marginally erased, i.e. not in full depletion, do not impact the read.

ADVANTAGES OF THE DISCLOSED CATE CELLS

1. The cells use the majority carriers in the channel to write the cell and do not depend on the high drain junction fields to generate hot carriers for charging the floating gate.

2. The use of large volume of majority carriers in the channel having the correct velocity component for write provide high efficiency of capture by the floating gate and hence reduce the high channel current requirements.

3. The use of majority carriers with low drain fields allow lower voltages to be applied on the junctions.

4. The reduction in impact ionization reduces the formation of unusable positive charge carriers which constitute a large component of the supplied current during programming thereby reducing greatly the power supply capability needed.

5. The use of the velocity of carriers in the channel to enhance the write characteristics of the cell allow reduced applied voltage on the gate electrodes.

6. The reduction in the depletion layer fields due to reduced junction voltages applied and the reduced field across the oxides from lower applied gate voltages improve the reliability of the cell.

7. Reduction or elimination of impact ionization reduce latch-up problems and associated reliability concerns for the cell.

8. The use of lower voltages at the junctions and the gates for programming make the cell suitable for low voltage programming operations and single low power supply operations.

9. The lower voltages and currents used allow better vertical scaling of oxides and junctions allowing the optimum use of technology advances.

10. The reduced voltage of operation allows for reduced isolation requirements and allow for closer packing of the cells.

11. The cells by controlling the write and erase operations by voltage application on the decoded drain through the bit lines allow for bit, byte and block erase as required.

12. Use of a select region which also acts as the accelerating region, with a gate which is independently controlled allow the devices to be erased to depletion without causing bit line failure.

13. Having a select transistor region allow cells to be erased without first writing them as the spread in threshold is not a critical factor in the operation of the array.

14. Having an independently controlled select gate allow optimization of the gate voltage to achieve high velocity with low drain voltages applied to the device. It also allows high accelerating voltages to be applied to the control gate region over the storage node allowing fast write by channel accelerated tunneling carrier method.

15. The independently controlled select region allow low voltages to be impressed on the drain and the accelerating gate (select gate) while applying high voltage to the control gate without increasing the programming current.

16. The use of the select portion of the channel reduce the leakage currents and read disturb problems associated with present day cells by isolating the unselected cells from the circuit.

SUMMARY RAMIFICATIONS AND SCOPE

The disclosure relates to new cell structures, typically of the non volatile type, capable of being programmed and erased electrically, with low drain voltages and currents, by using the CACT method of programming and tunnel erase. These memory cells by integrating a select/accelerating channel gate region with a storage region, having independently controlled gates allow the cells to be erased to depletion allowing for ease of design. The elimination of the high junction voltages, fields and currents improve the reliability of the cells. The low currents and low junction voltages also allow low power operation. The use large volume of channel accelerated carriers, having the correct velocity component to enhance collection by the floating gate allow for fast write. The use of these cells will hence allow for high density low voltage low power application and allow faster growth of non-volatile memory applications Although the description above contains many specificities, these should not be construed as limiting the scope of the invention, but only as providing an illustrative example. It is possible for those practicing the art to define and modify the structure as understanding of the method and structure improves. Some possibilities are the use of different materials and stacks of materials, including Gallium Arsenide and other semiconducting materials.

What is claimed is:

1. A memory cell, capable of being programmed by using channel accelerated carrier tunneling method of programming, and erase by tunneling, having a select/accelerating region, along a sidewall of a trench, etched into a surface of a semiconducting layer, a memory region, adjacent the sidewall of the trench, on the surface of the semiconducting layer, a step having an edge formed at an intersection of the sidewall of the trench with the surface of the semiconducting layer, a drain on the surface of the semiconductor material, spaced away from the trench, adjacent the memory region, a source at a bottom of the trench, an integrated channel formed by the select/accelerating region and the memory region between the source and the drain, a carrier discontinuity, in the channel, formed at the edge of the step, a first conductive gate material, overlaying the select/accelerating region but separated from it by a gate dielectric, which allow independent control of the select/accelerating region of the integrated channel by application of a voltage to the first conductive layer, a memory element, comprising a floating gate electrode overlaying the memory region but separated from it by a tunnel dielectric, and a control gate overlaying the floating gate electrode but separated from it by an interlayer dielectric, which allow independent control of the memory region by potential on the floating gate electrode, due to charge stored in the floating gate electrode and coupled down voltage from the control gate.

2. The memory cell, capable of being programmed by using the channel accelerated carrier tunneling method of programming, and erased by tunneling, of claim 1, wherein the programming is by carriers accelerated in the select/accelerating region of the integrated channel, directed at the discontinuity, where velocity of the carriers in the select/accelerating region of the channel, enhanced by a field due to a high floating gate potential, allow collection by the floating gate electrode, charging the floating gate electrode and changing its potential, there by modifying channel conductivity in the memory region of the channel.

3. The memory cell, capable of being programmed by using the channel accelerated carrier tunneling method of programming, and erased by tunneling, of claim 1, wherein the programming is by turning the integrated channel of the memory cell on by, application of a voltage to the first conductive layer to turn the select/accelerating region on, application of a second voltage to the drain of the device, and applying a high voltage to the control gate, which gets coupled down to the floating gate electrode, such that carriers moving with a velocity in the select/accelerating region of the channel are directed at the discontinuity in the channel, where they are further accelerated by a field due to the voltage coupled down to the floating gate electrode, resulting in channel accelerated accelerated carrier tunneling at the discontinuity, thereby charging the floating gate electrode and modifying channel conductivity in the memory region of the channel.

4. The memory cell, capable of being programmed by using the channel accelerated carrier tunneling method of programming, and erased by tunneling, of claim 3, wherein the programming is without deliberate generation of hot carriers by impact ionization close to the discontinuity in the channel where programming takes place.

5. The memory cell, capable of being programmed by using the channel accelerated carrier tunneling method of programming, and erased by tunneling of claim 1, wherein the erase is by removal of charge from the floating gate electrode by application of a potential gradient across the tunnel dielectric of sufficient magnitude to cause tunneling of carriers from the floating gate, through the tunnel dielectric.

6. The memory cell, capable of being programmed by using the channel accelerated carrier tunneling method of programming, and erased by tunneling, of claim 1, wherein the read is by taking a measure of conductivity of the memory region of the channel.

7. The memory cell, capable of being programmed by using the channel accelerated carrier tunneling method of programming, and erased by tunneling, of claim 1, wherein the memory is read by turning on the select/accelerating region of the channel and applying a voltage to the drain to sense current flowing in the cell, which provides a measure of conductivity of the memory region of the channel.

8. A memory cell capable of being programmed, by carriers in a channel of a MOS device directly, using Channel Accelerated Carrier Tunneling method of programming, comprising, a semiconducting layer, doped by an impurity of a first conductivity type a trench etched into a surface of the semiconducting layer, a step having an edge along an intersection of the surface of the semiconducting and a sidewall of the trench, a gate dielectric deposed on the side wall of the trench and bottom of the trench, isolating the trench from the semiconducting layer, an impurity, of a second conductivity type, forming a source of the MOS device, introduced into the bottom of the trench, a first conductive gate material filling the trench, an insulating dielectric layer overlaying the trench, a tunnel dielectric layer deposed on the surface of the semiconducting layer adjacent the step, a second conductive layer deposed over the tunnel dielectric layer, forming a floating gate electrode, an interlayer dielectric deposed over the floating gate electrode, a third conductive layer, forming a control gate, overlaying the interlayer dielectric, an impurity of the second conductivity type, forming a drain of the MOS device, introduced into the semiconducting layer surface, spaced away from the side wall of the trench, adjacent the floating gate electrode, memory element formed of the floating gate electrode, the interlayer dielectric and the control gate, an integrated channel of the MOS device, formed between the source and the drain, having
 a first independently controllable select accelerating region, under the gate dielectric, along the side wall of the trench, controlled by a voltage applied to the first conductive layer and
 a second independently controller memory region, on the surface of the semiconducting material, under the tunnel dielectric separating the memory element from the semiconducting layer, controlled by charge on the floating gate combined with potential applied to it by coupling down from the control gate, a carrier discontinuity in the channel at edge of the step, towards which carriers in the select accelerating region are directed, to achieve channel accelerated tunneling during programming.

9. The memory cell, capable of being programmed, by using the channel accelerated carrier tunneling method of programming, of claim 8, wherein the first conductive gate material is polysilicon.

10. The memory cell, capable of being programmed by using the channel accelerated carrier tunneling method of programming, of claim 8, wherein the second conductive layer and the third conductive layer are polysilicon.

11. The memory cell, capable of being programmed by using the channel accelerated carrier tunneling method of programming of claim 8, wherein the interlayer dielectric is an Oxide-Nitride-Oxide structure (ONO).

* * * * *